United States Patent [19]

Kos

[11] Patent Number: 5,111,936
[45] Date of Patent: May 12, 1992

[54] WAFER CARRIER

[75] Inventor: Robert D. Kos, Victoria, Minn.

[73] Assignee: Fluoroware, Chaska, Minn.

[21] Appl. No.: 620,274

[22] Filed: Nov. 30, 1990

[51] Int. Cl.$^5$ ............................................. B65D 85/48
[52] U.S. Cl. .................................... 206/334; 206/454; 211/41
[58] Field of Search ............... 118/500; 206/328, 334, 206/454; 211/40, 41

[56] References Cited

U.S. PATENT DOCUMENTS

| | | |
|---|---|---|
| D. 221,688 | 8/1971 | Eisfelder . |
| 1,764,754 | 6/1930 | Scott . |
| 1,885,691 | 11/1932 | Dressler . |
| 2,019,722 | 11/1935 | Neumeyer . |
| 2,156,955 | 5/1939 | Page . |
| 2,194,828 | 3/1940 | Greaves . |
| 2,407,021 | 9/1946 | Langel . |
| 2,453,030 | 11/1948 | Newman . |
| 2,729,375 | 1/1956 | Pace . |
| 2,774,472 | 12/1956 | Badalich . |
| 2,813,633 | 11/1957 | Welling . |
| 3,160,283 | 12/1964 | Lachance . |
| 3,365,070 | 1/1968 | Miles . |
| 3,394,819 | 7/1968 | Saville . |
| 3,442,395 | 5/1969 | Taylor . |
| 3,467,242 | 9/1969 | De Rousse . |
| 3,473,670 | 10/1969 | Elftmann . |
| 3,480,151 | 11/1969 | Schmitt . |
| 3,486,631 | 12/1969 | Rodman . |
| 3,487,948 | 1/1970 | Haidegger . |
| 3,498,597 | 3/1970 | Roberts et al. . |
| 3,501,047 | 3/1970 | Raabe . |
| 3,534,862 | 10/1970 | Shambelan . |
| 3,645,581 | 2/1972 | Lasch, Jr. et al. . |
| 3,701,558 | 10/1972 | Baker . |
| 3,737,282 | 6/1973 | Hearn et al. . |
| 3,819,076 | 6/1974 | Oehler . |
| 3,828,726 | 8/1974 | Dietze et al. . |
| 3,850,296 | 11/1974 | Hirata et al. . |
| 3,923,156 | 12/1975 | Wallestad . |
| 3,923,191 | 12/1975 | Johnson . |
| 3,926,305 | 12/1975 | Wallestad . |
| 3,930,684 | 1/1976 | Lasch, Jr. et al. . |
| 3,939,973 | 2/1976 | Wallestad . |
| 3,947,236 | 3/1976 | Lasch, Jr. . |
| 3,961,877 | 6/1976 | Johnson . |
| 4,043,451 | 8/1977 | Johnson . |
| 4,228,902 | 10/1980 | Schulte . |
| 4,256,229 | 3/1981 | Lee . |
| 4,318,749 | 3/1982 | Mayer . |
| 4,355,974 | 10/1982 | Lee . |
| 4,359,162 | 11/1982 | Mayer et al. . |
| 4,404,615 | 9/1983 | Dep ................................. 206/328 |
| 4,450,960 | 5/1984 | Johnson . |
| 4,471,716 | 8/1984 | Milliren . |
| 4,493,418 | 1/1985 | Johnson . |
| 4,520,925 | 6/1985 | Johnson . |
| 4,557,382 | 12/1985 | Johnson . |
| 4,566,839 | 1/1986 | Butler . |
| 4,669,612 | 6/1987 | Mortensen ....................... 211/41 |
| 4,687,097 | 8/1987 | Mortensen ....................... 206/454 |
| 4,721,427 | 1/1988 | Sanders et al. .................. 211/41 |
| 4,724,963 | 2/1988 | Mortensen . |
| 4,817,795 | 4/1989 | Kos ................................. 206/454 |
| 4,949,848 | 8/1990 | Kos . |

FOREIGN PATENT DOCUMENTS 0028266 5/1980 European Pat. Off. .
88/00072 2/1988 PCT Int'l Appl. .

(List continued on next page.)

*Primary Examiner*—Jimmy G. Foster
*Attorney, Agent, or Firm*—Palmatier & Sjoquist

[57] ABSTRACT

A moldable plastic carrier for predictably and steadfastly locating the carrier and wafers therein upon wafer transfer equipment has an open top for insertion and removal of the wafers, a pair of opposed upright sidewalls with inner opposed ribs and wafer pockets therebetween for spacing and supporting the axially aligned wafers in the carrier. The carrier has a pair of opposed upright end walls with one upright end wall being indexable upon the transfer equipment. The one end wall has opposing transfer equipment to contact rails each with upper and lower portions. An arch is formed between the upper and lower portions thereby forming a 4-point contact with the transfer equipment.

13 Claims, 4 Drawing Sheets

FOREIGN PATENT DOCUMENTS 1334330 10/1973 United Kingdom .
1571306 12/1976 United Kingdom .

OTHER PUBLICATIONS

Osgar Patent Application for Welding Fluoropolymer Pipe and Fittings.
Emerson Spin-Dryer Model #2 P-3 brochure, Emerson Plastronics, Inc.
Fluoroware, Inc. 1987 Catalog.
Brochure: Loader/Unloader and Sender/Receiver 6100 Series Industrial Modular Systems Corporation.
IBM Technical Enclosure Bulletin: vol. 8, No. 11, Apr. 1966, re Wafer Package.
Etch Boat for Wafers, R. M. De Fries.
Silicon Technology Corporation Bulletin 4102: STC Wafer Baskets.
Emerson Plastronics, Inc. "Throw Away Your Tweezers".
Industrial Modular Systems Corporation "Wafer Carriers".
Peninsula Electronics Mar. 29, 1971 Brochure re automated application of photoresist coatings to wafers, Model 6604, Indust. Modular Sys.
Advances in Chemistry Series 96, Am. Chemical Soc. Wash., D.C. 1969 "Engineering Plastics and Their Commercial Development", G. Foy.
"Engineer's Guide to Phenolic Plastics", by E. P. Florentine, Jr. and R. D. Rendine, Plastics Dept. General Electric Co.
"How to Avoid Warpage Problems In Injection Molded Parts", Jan. 1974.
"Fluoropolymers Now Are Tougher and Easier to Process", Materials Engineering, Aug. 1972.
"Versatile engineering thermoplastic combines dimensional stability, resistance to heat and water", Materials Eng. Dec. 1971.
"Plastic Mold Engineering", Rev. Ed., Edited by Du Bois.
"Plastics Technology", Basic Materials and Processes Robert S. Swanson, Ph.D.
"Engineering Design for Plastics", ed. by Eric Baer, Polymer Science and Engineering Series.
Am. Society for Tool and Manufacturing Engineers 1962 "Fundamentals of Design".
Engineering Data for Product Design, Ed. by Douglas Greenwood.
Plastics Engineering Handbook of the Society of the Plastics Industry, Inc.
Dictionary of Terms used in the theory and practice of Mechanical Engineering, 8th Ed. 1960.
Machinery's Handbook, 16th Edition, 1959.
Plastics Engineering Handbook, The Society of the Plastics Industry, Inc.
"Structural Design in Metals", by Williams Harris.
Elementary Structural Analysis by Wilbur and Norris 1948.
"The Production and Properties of Plastics", by Kaye 1947.
"An Introduction to Engineering Plastics", by Brown and Harris.
Applied Plastic Product Design by Davis and Beck 1946.
Plastics Handbook for Product Engineers by Sasso 1946.
"Handbook of Plastics", by Simonds and Ellis, Aug. 1943.
"Industrial Plastics", by Simonds 1939, 1st Ed.
Hutchinson's Technical & Scientific Encyclopaedia 1935.
Plastics Design "Foamed Structures House the 'Wizard of Avis'", 1972 Plastics World.
"Structural Foam in Your Future? It's closer than you Think!", Apr. 1972 Plastics World.
May 1971 Plastics World: Plastics Design—Sign Savvy Lies Behind Attractive Moldings.
Designers: Remember these FRTP Basic May 1971 Plastics World.
Plastics Design Sep. 1973 Plastic World: Glass spheres reduce part shrinkage.
Plastic Product Design, Ronald D. Beck.
Modern Industrial Plastics, T. Richardson.
Tool Engineering Handbook 1959 (ASTME).
The Journal of Teflon, vol. 7, No. 3, Apr. 1966, "Design Guidelines for Injection-Molded FEP Parts".

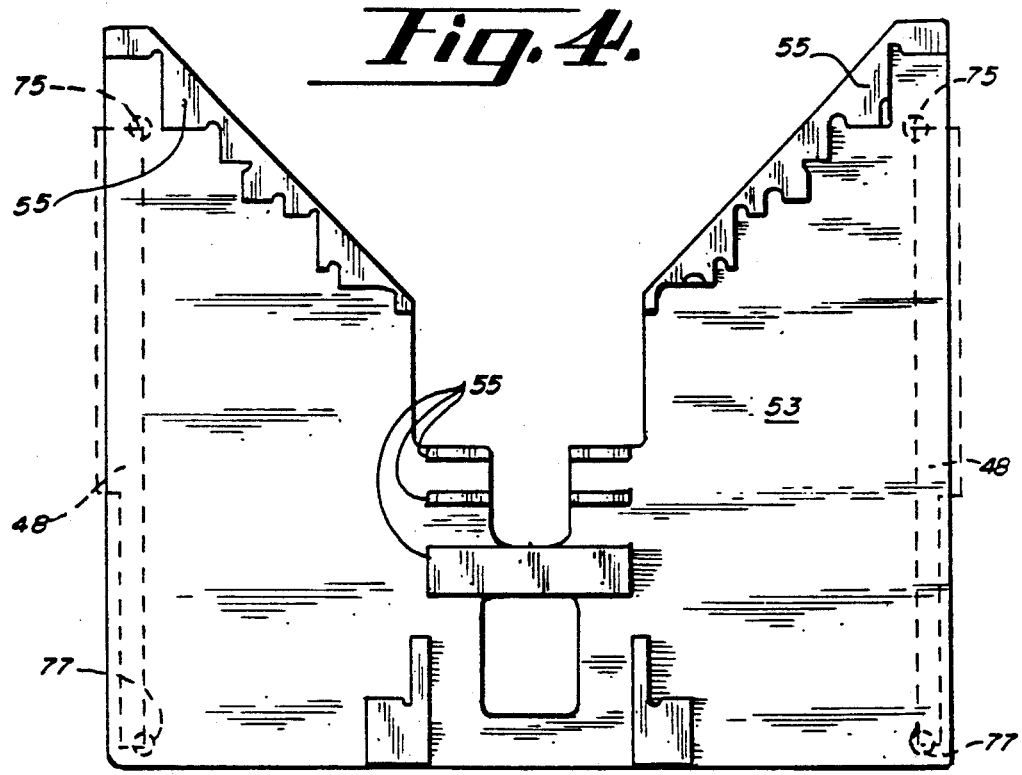
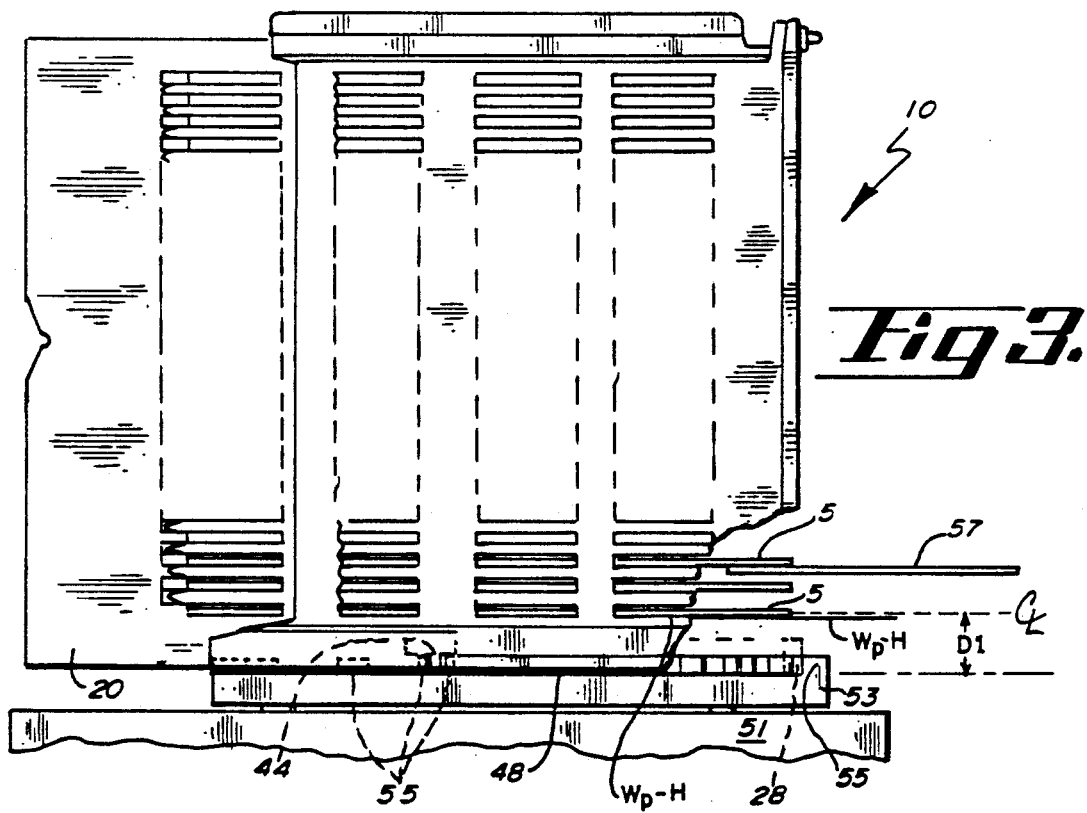

WAFER CARRIER

BACKGROUND OF THE INVENTION

This invention relates to a moldable plastic wafer carrier or basket for silicon wafers which are designed for the transportation, storage and processing of silicon wafers used in the production of integrated circuit chips.

The processing of wafers towards integrated circuit chips requires that they be successively immersed, sprayed and/or rinsed with liquids or gases. Some of the chemical baths include various corrosive chemicals while certain of the baths are extremely hot, in the range of 180° C. Wafers that are presently being processed have diameters as large as eight inches.

It should be recognized that silicon wafers are extremely delicate and brittle and may be only a few thousandths of an inch thick. The silicon wafers are extremely valuable and breakage of a wafer may represent a significant loss. Particulate and other contamination of wafers must also be avoided in order to manufacture integrated circuit chips operable within the range of standards set by the industry. Thus, there has been an increase in automated handling of the silicon wafers 5 axially aligned in batches supported in wafer carriers or baskets 10. Vacuum wands or fingers 57 are being utilized for handling individual silicon wafers after the carrier 10 is indexed, elevated and supported by wafer transfer equipment or devices 51. Robotic arms are also used for transporting the carrier 10 from station to station.

Typically, twenty-five of such wafers 5 are within a single wafer basket or carrier 10 which requires that a carrier be large enough for this capacity. Such a carrier, which is full of wafers, will easily weigh eight to 10 pounds. Two Hundred millimeter (200 mm) wafers are also now being used and will be in common use in the foreseeable future. Wafer carriers typically used to hold the silicon wafers are often conveniently formed of moldable plastic such as polypropylene, polyetheretherketone, PFA Teflon ® (a registered trademark of E. I. du Pont Nemoirs company of Wilmington, Del.), perfluoroalkoxy-substituted polytetrafluoroethylene resin or other suitable plastics which are suitably inert, do not have significant out gasing characteristics, and will not corrode.

More specifically referring to FIGS. 1-4, the silicon wafers 5 may be seen within a wafer carrier 10 and in conjunction with known silicon wafer transfer equipment and devices 51 and 57. Wafer carriers 10 are disclosed in more detail in co-owned U.S. Pat. No. 4,949,848 issued on Aug. 21, 1990. Carrier 10 includes an open top 11, open bottom 12, upright sidewalls 13 with opposing lower wall portions 14 offset inwardly. Sidewalls 13 may include windows, cutaways or wash slots 16 along with opposing and inwardly projecting ribs 18 which have appropriately twenty-five wafer pockets or slots $19^1$-$19^{25}$ therebetween. Foot panels 20 join the lower wall portions 14 and support the carrier 10 when in its upright position. The top surfaces 22 of foot panels 20 support the wafers 5 within the carrier 10. At the top of sidewalls 13 are located flanges 28.

Carrier 10 has an H-shaped end wall 40 suitably with an H-shaped flange 42 which supports and adds strength to a horizontal indexing bar 44. When carrier 10 is stood on it H-shaped end wall 40, it is supported by H-bar contact rails or struts 45 each of which may have a robot pickup flange 46 and a contact surface 48. Some carriers may have machined nubs, knobs, or pads 49 on the contact surface 48. Carrier 10 also has an opposing end wall 50 opposite H-shaped end wall 40.

As stated, carrier 10 may be stood on its H-shaped end wall 40 with the indexing bar 44 used for properly indexing the carrier 10 on an elevator or a wafer transfer equipment device 51. The wafer transfer device 51 has a vertically movable positioning platform or plate 53 with carrier indexing positioners or webbing 55 thereon. By this arrangement, the indexing bar 44 may be properly located within the positioners 55 and the carrier 10 elevated upwardly or downwardly to position individual wafers 10 in front of a wafer removal or transfer device, such as a vacuum wand or finger 57. There are other end wall configurations for indexing but H-shaped end wall 40 is most common.

Due to the numbers of manufacturers of silicon wafers, wafer carriers, wafer transfer equipment, wafer processing chemicals and equipment, and integrated circuit chips. Semiconductor Equipment and Materials Institute, Inc. (SEMI) was formed and is located in Mountain View, Calif. 94043. SEMI, with industry participation, has set specifications and standards for wafers, carriers and equipment configurations. According to the SEMI standards, D1 is the tolerable distance from the contact surface 48 of the H-bar contact rails 45 to the centerline $C_L$ of the first wafer pocket $19^1$. Illustratively, D1 for a 150 mm (5.91 inches) carrier should be 0.5725 inches ±0.005 inches (14.54 mm±0.13 mm). With respect to the wafer 5 and the first pocket $19^1$, the bottom edge of the wafer or the wafer plane $W_p$-H must be 0.035 inches±0.025 inches (0.89 mm ±0.635 mm) from the pocket centerline $C_L$. Manufacturers of semiconductor processing materials and equipment who stay within these standards find that their materials and equipment are acceptable among wafer processors in that the silicon wafers 5 within carriers 10 are in predictable locations for suitable handling by processing equipment and devices 51 and 57.

When a wafer carrier 10 is molded or formed out of a plastic, such as PFA Teflon ®, the carrier during its molding, curing and setting up process is subject to forces and stresses due to the molten plastic location and associated shrinking forces which typically result in some degree of carrier warpage and/or shrinkage. Consequently, the carrier manufacturing industry has been required to have a narrow window of acceptable molding process parameters including temperature, pressure and time in an effort to minimize carrier warpage and shrinkage and to maintain strict industry and/or SEMI wafer carrier standards.

Depending upon the particular configuration and plastic material, many molded carriers experience shrinkage and warpage to a degree that they are unfit for use and are rejected. Rejection of some carrier configurations difficult to mold maybe in a range of up to 50 percent. Rejection may occur when the particular carrier does not fit within the SEMI standards, experiences a "rocking chair" effect in that it does not sit steadily flat upon the wafer transfer equipment 51, or experiences a wafer tilt. Water tilt means that the wafers are not oriented true to horizontal but rather may have their top edges, when in the indexed carrier, tilted downwardly. Equipment access to wafers in this condition often results in breakage and contamination.

There is a need for a moldable plastic wafer carrier with a wide window of acceptable molding process parameters. Such a carrier should readily compensate for the stresses and forces which result in carrier warpage and shrinkage during its formation. The carrier should compensate for wafer tilting and should not rock when standing on its H-shaped end wall. Although some warpage and shrinking may be inevitable, the carrier should have compensating features which are not susceptible to the deleterious effects of warpage and shrinking. The carrier should be predictably and steadfastly locatable upon wafer transfer equipment as its supports and carriers wafers. Finally, such a carrier should not be subject to a measurable range of rejection due to nonconformance with industry accepted standards and SEMI specifications.

SUMMARY OF THE INVENTION

A moldable plastic carrier for predictably and steadfastly locating the carrier and wafers therein upon wafer transfer equipment has an open top for insertion and removal of the wafers, a pair of opposed upright sidewalls with inner opposed ribs and wafer pockets therebetween for spacing and supporting the axially aligned wafers in the carrier. The carrier has a pair of opposed upright end walls with one upright end wall being indexable upon the transfer equipment. The one end wall has opposing transfer equipment contact rails each with upper and lower portions. An arch is between the upper and lower portions thereby forming a 4-point contact with the transfer equipment.

A principal object and advantage of the present invention is that the wafer carrier has a wider window of acceptable molding process parameters than heretofore.

Another object and advantage is that the present invention readily conforms to the SEMI standards, compensates for the occurrence of wafer tilt and is not easily subject to the deleterious effects of warpage and shrinkage as to interfere with its usage in storing, transporting and processing of silicon wafers.

Another object and advantage of the present invention is that it predictably and steadfastly permits location of the carrier and wafers therein upon the wafer transfer equipment without rocking to minimize wafer damage and loss and to maximize processed silicon wafer and integrated circuit chip yields.

All these objects and advantages are realized by strategically locating only a small amount of plastic material on the molded carrier. It is important to note that a small amount of material is not as susceptible to warpage or shrinkage as is a large amount of plastic material.

BRIEF DESCRIPTION OF THE DRAWINGS

FIG. 3 is a side elevational view of the wafer carrier upon a wafer transfer device;

FIG. 4 is a top plan view of the vertically movable platform of the wafer transfer device showing the prior art carriers' and the present invention's places of contact with the device;

DETAILED DESCRIPTION

Figure 1:
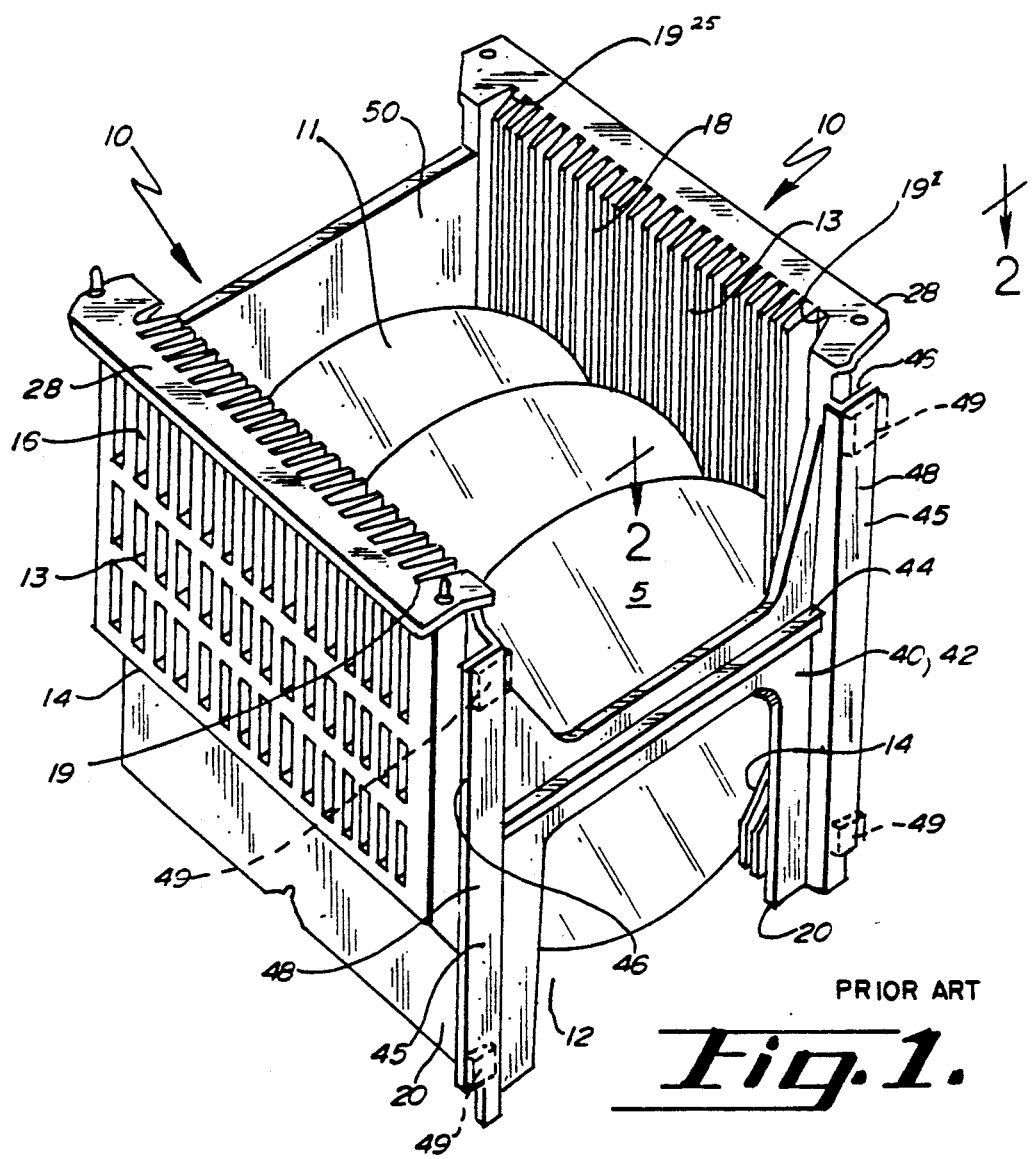
FIG. 1 is a perspective view of a prior art wafer carrier with several silicon wafers therein.
Figure 2:
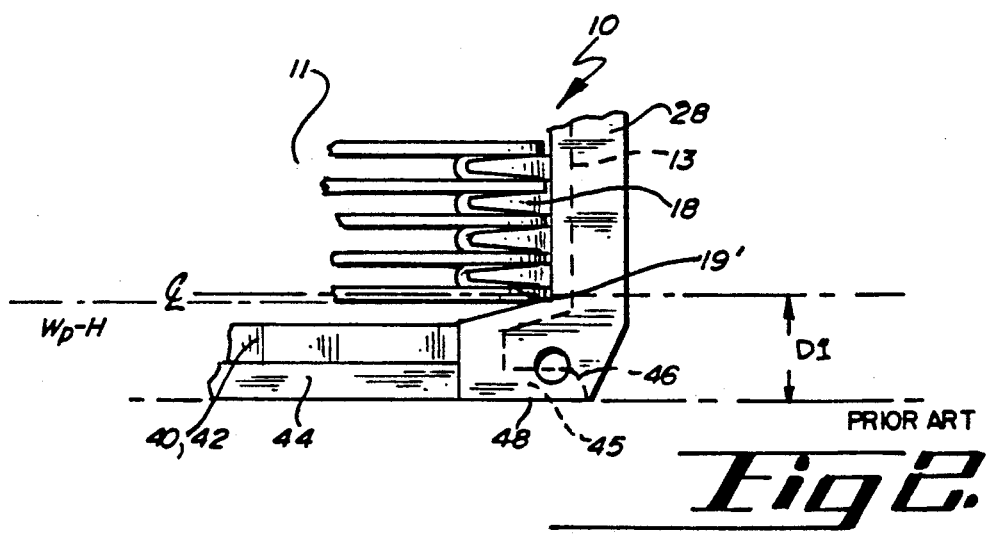
FIG. 2 is a broken away end view of the prior art carrier of FIG. 1 taken along lines 2—2 of FIG. 1 with the carrier resting on its H-shaped end wall.
Figure 5:
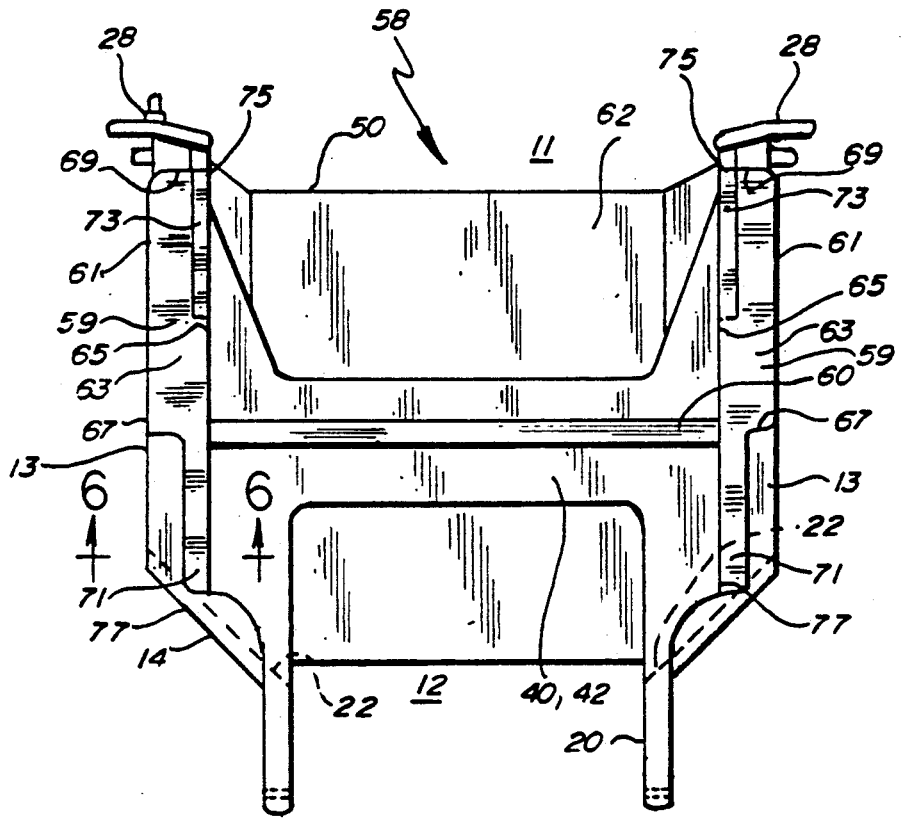
FIG. 5 is a front elevational view of the present carrier with improved contact H-bar rails.
Figure 6:
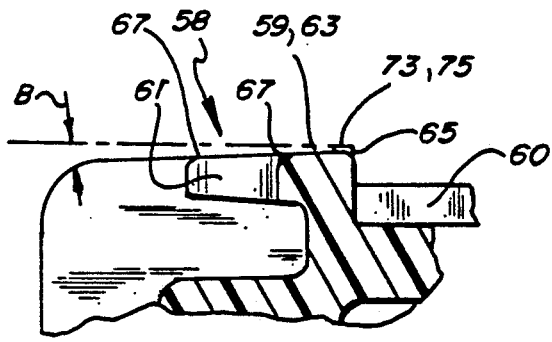
FIG. 6 is a broken away cross-sectional view taken along lines 6—6 of FIG. 5.
Figure 7:
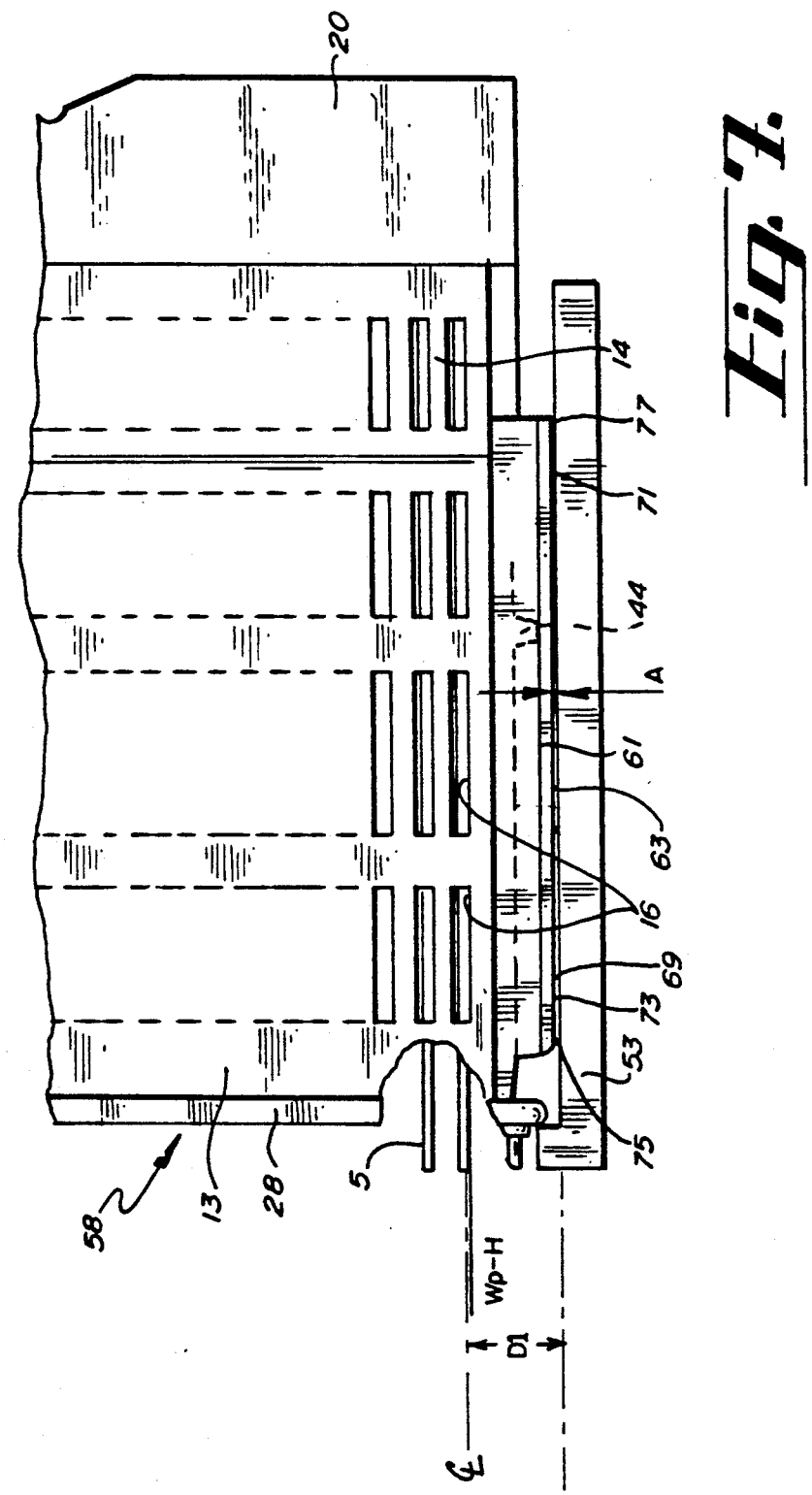
FIG. 7 is a side elevational view of the present carrier indexed upon the vertically movable positioning platform or plate of a wafer transfer device.

Referring to FIGS. 5-7, the improved wafer carrier 58 may be seen. Similar to the prior art wafer carrier 10, the present carrier 58 preferably may include an open top 11, open bottom 12, sidewalls 13, offset wall portions 14, wash slots 16, ribs 18, wafer pockets $19^{1-25}$, foot panels 20 with wafer support surfaces 22, flanges 28 and end wall 50.

The improved carrier 58 has end wall contact rails or struts 59 located at H-shaped end wall 60. Other end wall configurations are suitable for this invention. The rails 59 are substantially flat, opposing, parallel and mere images of each other. The rails 59 have outwardly projecting robotic pickup flanges 61. On the front side of rails 59 are located contact surfaces 63 which have an inner edge 65 and an outer edge 67. There is preferably a rearward slope or draft from the inner edge 65 to the outer edge 67 which appropriately may be approximately 2° as represented by angle B which puts the inner edge 65 of surface 63 forwardmost. The contact surfaces 63 of rails 59 each have an upper portion 69 and a lower portion 71.

On the upper portion 69 of the contact surface 63 of each rail 59 is located a raised ramp or incline 73 of plastic material which is molded into the carrier 58 preferably located along inner edge 65. Illustratively and not restrictively stating, the ramp 73 suitably may be 1.5 inches long, 0.06 inches wide, and 0.018 inches high at its beginning on the upper portion 69. As shown in FIG. 7, the gap A formed by arch intermediate the upper portion 69 and lower portion 71 measures approximately 0.015 inches. By this arrangement, carrier 58 has four points of contact 75 and 77 on end wall 60 with whatever it is indexed or set upon.

The illustrative dimensions of the ramp 73 along the upper portion 69 of contact surface 63 and inner edge 65 is quite noticeably nominal with respect to the overall carrier 58. In other words, the amount of plastic material required for ramp 73 is relatively small. It is known that molded plastic materials are subject to more stresses and forces of warpage and shrinkage when the material is in larger amounts versus smaller amounts. The present ramp 73 takes advantage of this phenomenon. The four point contacts 75 and 77 of carrier 58 are not so readily susceptible to warpage and shrinkage with respect to each other. Consequently, carrier 58 is not likely to experience the rocking chair effect and will steadily sit on any surface. Utilizing the more massive entire contact surface 48, which is more so susceptible to warpage and shrinking, renders the prior art carriers 10 more susceptible to the rocking chair effect.

The dimensions of the ramp 73 may vary depending upon the carrier configuration and the plastic material from which the carrier 58 is molded. The configuration of the carrier 58 becomes a factor to ramp 73 dimensions by virtue of the location and mass of the plastic with respect to various walls and components of the carrier. Where one carrier has more plastic in some areas and less plastic in other areas, the forces and stresses that the carrier undergoes during it molding, curing and setting up varies from one carrier to another. This results in different shrinkage and warpage depending upon the carrier configuration. Consequently, the ramp 73 may be of a larger or smaller dimensions depending upon carrier configuration. Similarly, the shrinking and warping characteristics of the plastic material from which the carrier is molded may effect ramp 73 dimensions.

Considering these factors, the ramp or incline 73, has been found to vary in height from a range from 0.010 to 0.020 inches depending upon the particular carrier material and configuration. The length of the ramp 73 may be appropriate to smoothly blend the ramp 73 into the contact surface 63 as to minimize fluids from clinging to the carrier. Also by this arrangement, contact point 75 of the ramp 73 and not the entire length of the ramp 73 is contacting the equipment 51. The small degree of draft or slope advantageously creates point contact 75 and 77 rather than supporting carrier 58 along any edge which is more susceptible to warpage and shrinking.

By having four contact surfaces 75 and 77 versus a full contact rail surface 48, as shown in FIG. 4, the carrier will acceptably allow some rail 59 warpage, even between contact points 75 and 77, but yet will not experience the rocking chair effect. Further still, the present carrier 58 by virtue of its tolerance for shrinkage and warpage may be process molded in a wider window of acceptable parameters including temperature, pressure and time while yet remaining within the SEMI and industry standards and specifications previously discussed.

The present invention may be embodied in other forms without departing from the spirit or essential attributes thereof; therefore, the illustrated embodiments, particularly the specified dimensions ramp 73, should should be considered in all respects as illustrative and not restrictive, reference being made to the appended claims rather than to the foregoing description to indicate the scope of the invention.

What is claimed is:

1. A molded plastic carrier for wafers, the carrier being indexable upon a flat platform of wafer transfer equipment with indexing webbing on the platform, having an open top for insertion and removal of the wafers, a pair of opposed upright sidewalls with inner opposed ribs and wafer pockets therebetween for spacing and supporting the wafers in axial alignment in the carrier, one upright end wall with a horizontal indexing bar being indexable upon the webbing of the transfer equipment, comprised of opposing, upright transfer equipment contact rails each with upper and lower portions with an arch therebetween formed by an upright ramp along one of the portions of the rails one each rail thereby forming a four point flat contact between the carrier and platform of the transfer equipment.

2. The carrier of claim 1, wherein each of the contact rails have inner and outer edges that slope rearwardly from the inner edge to the outer edge.

3. The carrier of claim 2, wherein the four points of contact are at the inner edges of the upper and lower portions.

4. The carrier of claim 2, wherein the ramp is on each rail along the inner edge beginning at the upper portion and sloping toward the lower portion with the upper portion contact points being at the top of the ramps.

5. The carrier of claim 1, wherein the one end wall is H-shaped with an H-shaped flange and a horizontal indexing bar between the rails.

6. The carrier of claim 1, further comprising a robotic pick-up flange on the outside of the upper portion of each rail.

7. The carrier of claim 1, wherein each of the rails is substantially flat having an inner edge sloping rearwardly to an outer edge and a raised ramp forms the arch beginning at the upper portion and extending downward to intermediate of the upper and lower portions.

8. The carrier of claim 7, wherein the ramp becomes flush with the rail at the intermediate of the upper and lower portions.

9. The carrier of claim 8, where in the ramp is in a range of 0.010 to 0.020 inches high and extends to the lower portion between one and two inches.

10. The carrier of claim 9, where in the ramp is approximately 0.018 inches high.

11. The carrier of claim 8, wherein the ramp is approximately 0.06 inches wide.

12. A molded plastic carrier for wafers, the carrier being indexable upon a flat platform of wafer transfer equipment with indexing webbing on the platform, having an open top for insertion and removal of the wafers, a pair of opposed upright sidewalls with inner opposed ribs and wafer pockets therebetween for spacing and supporting the wafers in axial alignment in the carrier, one upright end wall with a horizontal indexing bar being indexable upon the webbing of the transfer equipment, comprised of opposing, upright transfer equipment contact rails each with upper and lower portions, an end surface; inner and outer upright side edges that slope rearwardly from the inner side edge to the outer side edge and a raised ramp projecting from said end surface along the inner side edge beginning at the upper portion and extending downwardly toward the flush with the end surface at said lower portion, thereby forming four points of flat contact between the carrier and the platform of the equipment at the inner side edges of the upper and lower portions.

13. A molded plastic carrier for wafers, the carrier being indexable upon a flat platform of wafer transfer equipment with indexing webbing on the platform, having an open top for insertion and removal of the wafers, a pair of opposed upright sidewalls with inner opposed ribs and wafer pockets therebetween for spacing and supporting the wafers in axial alignment in the carrier, one upright end wall with a horizontal indexing bar being indexable upon the webbing of the transfer equipment, comprised of opposing transfer equipment contact rails each with upper and lower portions and being substantially flat with an inner side edge sloping rearwardly to an outer side edge and a raised ramp beginning at the upper portion along the inner side edge and extending downward to intermediate of the upper and lower portions thereby forming four points of flat contact between the carrier and the platform of the equipment with two points of contact at the top of the ramps and the other two points of contact at the inner side edge of the lower portions.

* * * * *